United States Patent
Widdershoven et al.

(10) Patent No.: US 7,214,579 B2
(45) Date of Patent: May 8, 2007

(54) SELF-ALIGNED 2-BIT "DOUBLE POLY CMP" FLASH MEMORY CELL

(75) Inventors: Franciscus Petrus Widdershoven, Leuven (BE); Michiel Jos Van Duuren, Leuven (BE)

(73) Assignee: NXP B.V., Eindhoven (NL)

( * ) Notice: Subject to any disclaimer, the term of this patent is extended or adjusted under 35 U.S.C. 154(b) by 127 days.

(21) Appl. No.: 10/532,292

(22) PCT Filed: Aug. 18, 2002

(86) PCT No.: PCT/IB03/03672

§ 371 (c)(1),
(2), (4) Date: Apr. 21, 2005

(87) PCT Pub. No.: WO2004/038728

PCT Pub. Date: May 6, 2004

(65) Prior Publication Data

US 2006/0163642 A1    Jul. 27, 2006

(30) Foreign Application Priority Data

Oct. 24, 2002    (EP) .................................. 02079476

(51) Int. Cl.
*H01L 21/8239*    (2006.01)

(52) U.S. Cl. .................... 438/211; 257/316; 257/319; 438/201

(58) Field of Classification Search ........ 257/315–322; 438/266, 211, 201
See application file for complete search history.

(56) References Cited

U.S. PATENT DOCUMENTS

| 5,278,439 | A |   | 1/1994  | Ma et al. |
| 5,364,806 | A | * | 11/1994 | Ma et al. ..................... 438/266 |
| 5,414,693 | A |   | 5/1995  | Ma et al. |
| 6,329,248 | B1 |  | 12/2001 | Yang |
| 6,462,375 | B1 |  | 10/2002 | Wu |

FOREIGN PATENT DOCUMENTS

WO    WO 01 67517    9/2001

\* cited by examiner

*Primary Examiner*—Andy Huynh
*Assistant Examiner*—Earl N. Taylor
(74) *Attorney, Agent, or Firm*—Peter Zawilski

(57) ABSTRACT

Fabrication of a memory cell, the cell including a first floating gate stack (A), a second floating gate stack (B) and an intermediate access gate (AG), the floating gate stacks (A, B) including a first gate oxide (4), a floating gate (FG), a control gate (CG; CGl, CGu), an interpoly dielectric layer (8), a capping layer (6) and side-wall spacers (10), the cell further including source and drain contacts (22), wherein the fabrication includes: defining the floating gate stacks in the same processing steps to have equal heights; depositing over the floating gate stacks a poly-Si layer (12) with a larger thickness than the floating gate stacks' height; planarizing the poly-Si layer (12); defining the intermediate access gate (AG) in the planarized poly-Si layer (14) by means of an access gate masking step over the poly-Si layer between the floating gate stacks and a poly-Si etching step.

10 Claims, 8 Drawing Sheets

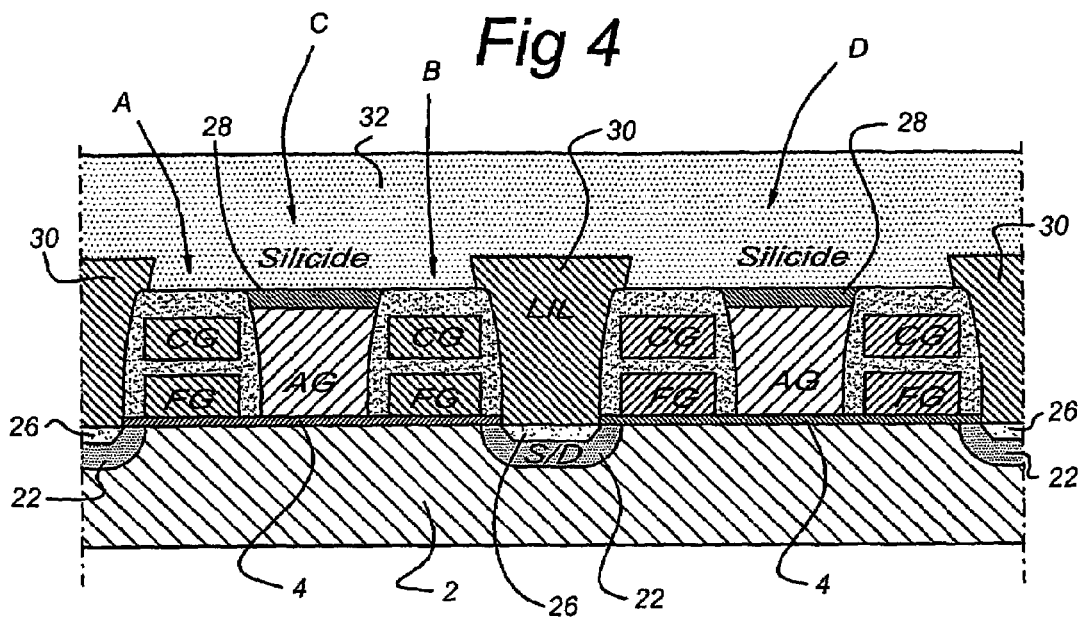
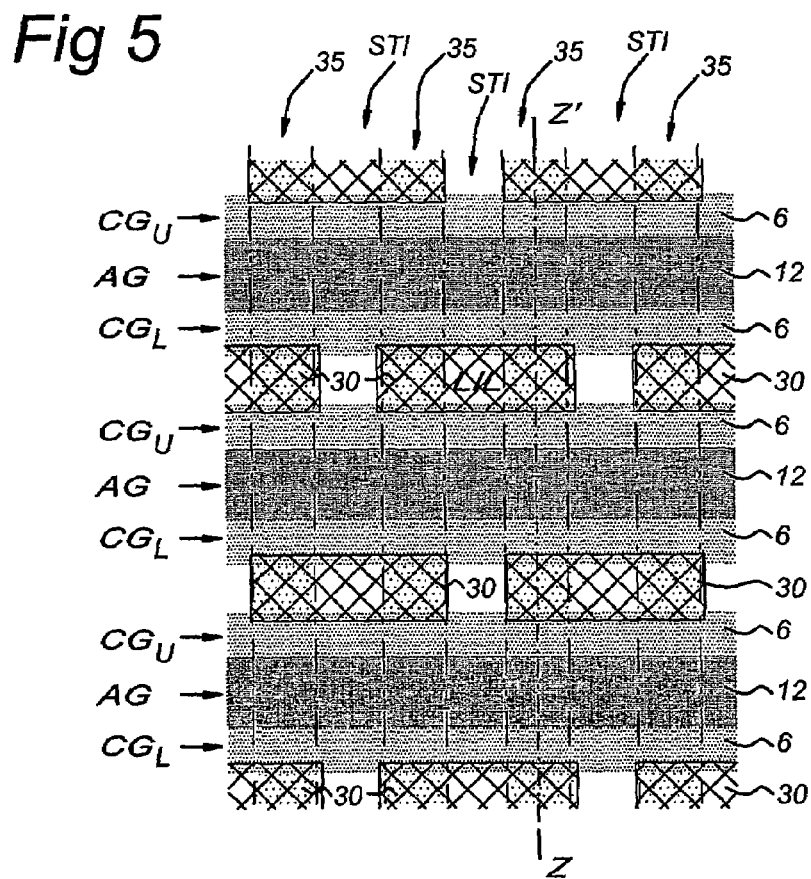

Active line  STI line

SELF-ALIGNED 2-BIT "DOUBLE POLY CMP" FLASH MEMORY CELL

This application is a 371 of PCT/IB03/03672 filed on Aug. 18, 2002.

The present invention relates to a method as defined in the preamble of claim 1. Also, the present invention relates to a Flash memory cell manufactured by means of such a method. Further, the present invention relates to a semiconductor device comprising at least one such Flash memory cell.

Compact memory cells are believed to be the next step towards higher density Flash memories (non-volatile memory cells, NVM cells). Such compact cells are known from U.S. Pat. No. 5,414,693 (and related U.S. Pat. Nos. 5,364,806 and 5,278,439), which describes a self-aligned dual-bit split gate (DSG) FLASH EEPROM cell and a method to manufacture such a cell.

However, such prior art compact cells suffer from the fact that the bit-lines of the Flash memory cells consist of buried (non-silicided) diffusions with relatively high electrical series resistance. To reduce the overall resistance of such bit-lines, the compact cells from the prior art require "strapping" of the bit-lines by a metal line.

Moreover, the formation of a buried diffusion in an embedded NVM cell manufacturing process requires an additional process-module. Disadvantageously, such a process module may be difficult to integrate in this embedded NVM cell process, as is known to persons skilled in the art.

A further disadvantage of the compact cells from the prior art is the layout of the control gate lines and select gate lines, relative to the buried bit-lines. The control gate lines run parallel to the bit-lines in a direction perpendicular to the direction of the select gate lines, which adversely influences the addressing scheme of a memory array of such compact cells.

Furthermore, lithographic processing of the compact cells from the prior art is complex due to lithographic processing of the implantation mask that keeps the bit-line diffusion implants out of the region between the two floating gates of a DSG cell. Such processing is difficult due to the local topography. To suppress interference in the resist during the exposure of a mask, usually an organic bottom anti-reflective coating (BARC) layer is spun on the wafer first, followed by spinning the actual photosensitive resist on top of the BARC layer.

Usually, the anti-reflective properties of the BARC layer are determined by an optimized combination of absorption and interference processes in the BARC layer. Due to the topography of the two floating gate/control gate stacks of a DSG cell the BARC layer will have non-uniform thickness. Adversely, as a result, its local anti-reflective properties are deteriorated, causing severe optical interference in the photosensitive resist on top of it.

Furthermore, the resist also will have a less uniform thickness than on a planar surface, making the problem even worse. Using inorganic instead of organic BARC partially allows for better control of the BARC thickness. However, after developing the resist the inorganic BARC should be removed by an anisotropic etching step. Disadvantageously, a residue of inorganic BARC spacers may be left where the BARC layer was deposited against a vertical surface (i.e., the sidewalls of the floating gate/control gate stacks).

It is an object of the present invention to provide a memory cell and a method to manufacture such a cell, which avoid the aforementioned disadvantages of a compact cell from the prior art.

The present invention relates to a method of fabrication as defined in the preamble of claim 1, characterized in that the method of fabrication comprises:
defining the first and second floating gate stacks in the same processing steps to have substantially equal heights;
depositing a poly-Si layer over the first and second floating gate stacks, the poly-Si layer having a larger thickness than the height of the first and second floating gate stacks;
planarizing the poly-Si layer by chemical mechanical polishing to obtain a planarized poly-Si layer using the capping layer of the first and second floating gate stacks as a polish stop layer;
defining the intermediate access gate in the planarized poly-Si layer by a masking step with an access gate mask over the planarized poly-Si layer between the first and second floating gate stacks and an etching step for poly-Si.

Advantageously, the method of the present invention reduces the problem of misalignment because the two floating gate stacks are defined during one lithographic step. Also, when defining, in a further step, an access gate by means of an access gate mask on the planarized poly-Si layer, the access gate length to be created in between the two floating gate stacks does not need to account for a misalignment between access gate mask and floating gate stacks.

Also, the present invention relates to a memory cell manufactured by such a method as described above, characterized in that
the first and second floating gate stacks have substantially equal heights;
the intermediate access gate comprises a planarized poly-Si layer in between the first and second floating gate stacks.

Moreover, the present invention relates to an array of memory cells as described above, characterized in that the array comprises at least two adjacent memory cells as described above.

Furthermore, the present invention relates to a semiconductor device comprising at least one such memory cell.

Below, the invention will be explained with reference to some drawings, which are intended for illustration purposes only and not to limit the scope of protection as defined in the accompanying claims.

FIG. 4 shows schematically a cross-section of the Flash memory cell in a first embodiment after silicidation, fabrication of local interconnect and pre-metal dielectric deposition;

FIG. 5 shows schematically a plane view of an exemplary memory array in a first embodiment comprising Flash memory cells, placed in a virtual ground architecture, after completion of the front-end of line processing and local interconnect layers;

Figure 1:
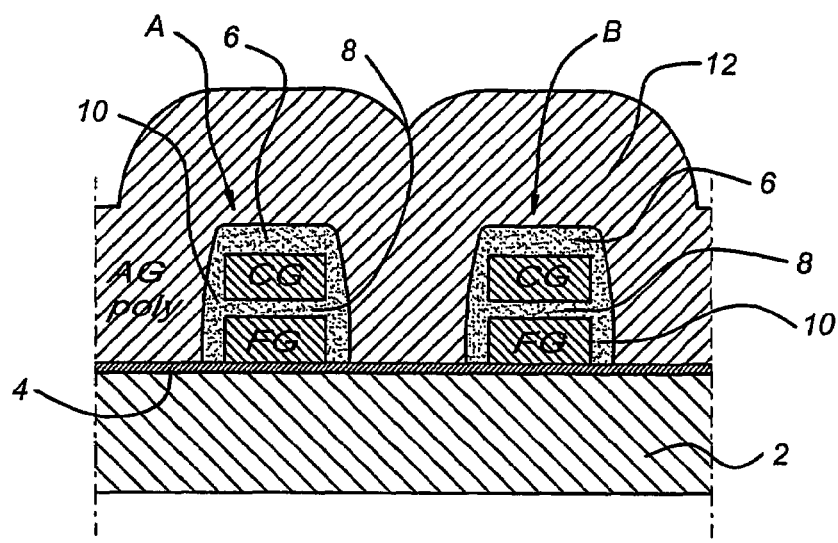
FIG. 1 shows schematically a cross-section of a Flash memory cell in a first poly-Si deposition step according to the present invention.

FIG. 1 shows schematically a cross-section of a Flash memory cell in a first poly-Si deposition step according to the present invention. On a semiconductor substrate 2, a first oxide layer 4 is thermally grown (or deposited) as a tunnel oxide. On this oxide layer 4 two floating gate stacks A, B have been defined in preceding process steps comprising lithography and etching as known to persons skilled in the art. A floating gate stack comprises a floating gate FG, an interpoly dielectric layer 8, a control gate CG, side-wall spacers 10, and a capping layer 6. Floating gate FG and control gate CG consist of poly-Si (or Si—Ge or even a metal). The poly-Si is doped, possibly in-situ. The interpoly dielectric layer 8 may consist of an ONO multi-layer (silicon diOxide/silicon Nitride/silicon diOxide), an ON layer or a silicon dioxide layer. The sidewall spacers 10 and capping layer 6 typically consist of silicon nitride.

Typically, after anisotropic nitride dry etching to make the spacers 10, the first oxide layer 4 is damaged (due to exposure to the etching plasma) in the region between the two adjacent floating gate/control gate stacks A, B. Therefore, the first oxide layer 4 has to be removed, typically by applying an HF-dip, and regrown to an appropriate thickness that may differ from the thickness of the original first oxide layer 4.

Finally, a poly-Si layer 12, also indicated as AG poly (Access Gate Poly), is deposited in blanket mode to cover the floating gate stacks A, B. It is noted that the poly-Si layer 12 is doped in-situ to provide sufficient charge carriers.

The in-situ doped poly-Si layer 12 can be either n+ or p+, depending on the required threshold voltage of the access transistor. It is noted that in case of p+ doping the doping concentration should be high enough to prevent it from being over-doped by the n+ source and drain implants later on in the process. Otherwise (and with reference to FIG. 3), the corresponding n+ implantation mask would have to cover the AG poly 14 during the n+ source and drain implantations, leading to similar lithographic processing deficiencies as for the prior art, as explained above.

In 0.12 μm technology generation, the following sizes of elements in the Flash memory cell may be used: the length of the floating gate is typically between 0.12 and 0.18 μm.

The thickness of a floating gate FG is between 50–200 nm, depending on the desired electrical properties. The thickness of a control gate CG is between 100 and 200 nm, also depending on desired properties. The distance between two adjacent floating gates (edge to edge) is between 0.15–0.25 μm. The sidewall spacers 10 have a typical width of 10–30 nm. The ONO layer 8 has a thickness of approximately 18 nm (typically 6 nm oxide, 6 nm nitride, 6 nm oxide). The capping layer 6 has a thickness between ~50 and ~150 nm. The poly-Si layer 12 has a typical thickness of 500 nm, depending on the thickness of other elements. Typically, the thickness of the poly-Si layer 12 is somewhat larger than the height of the floating gate/control gate stacks A, B.

Figure 2:
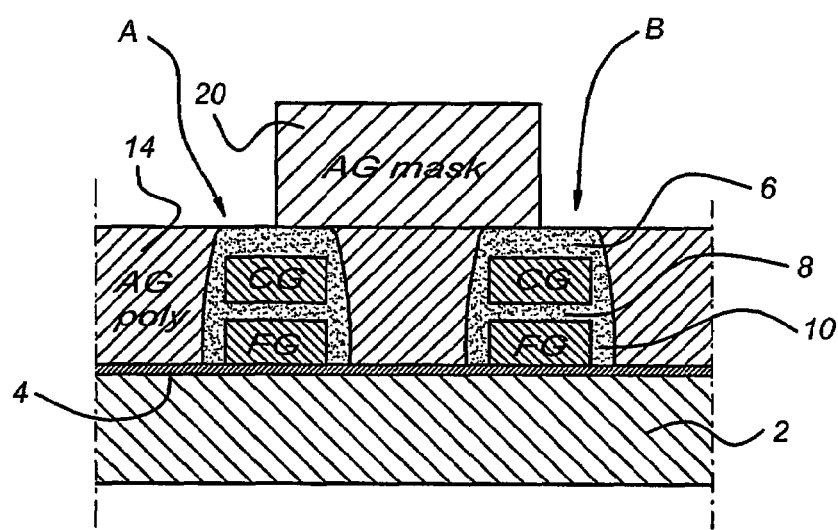
FIG. 2 shows schematically a cross-section of the Flash memory cell in a next lithographic step.

FIG. 2 shows schematically a cross-section of the Flash memory cell in a next lithographic step. The poly-Si layer 12 has been planarized by means of a poly-CMP step (CMP: chemical-mechanical polishing), resulting in a polished poly-Si layer 14. The capping layers 6 of the floating gate stacks A, B serve as a polish stop layer. Next, an access gate mask (resist layer) 20 is applied on the polished poly-Si layer 14 for the definition of the access gate, of which the alignment in this case is not a very critical step.

Advantageously, the poly-CMP process provides an even level of the floating gate stacks A, B and the access gate AG. The even level of the (stacked) gates A, B, AG simplifies the subsequent lithographic processing, as explained below.

Figure 3:
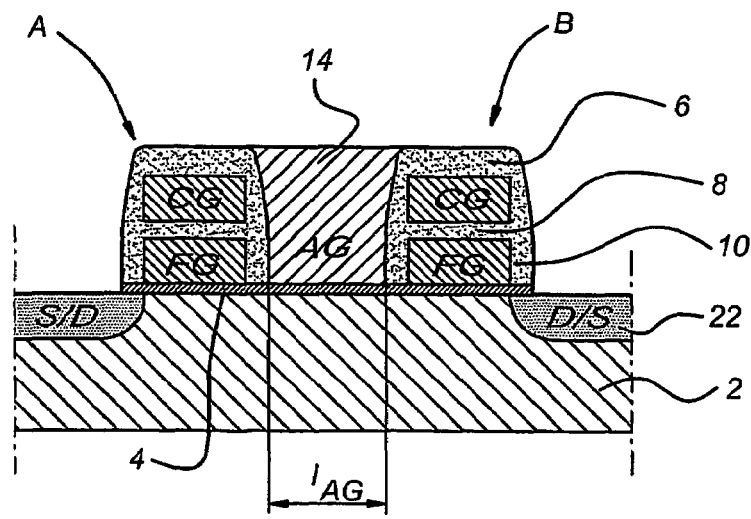
FIG. 3 shows schematically a cross-section of the Flash memory cell in a further manufacturing step.

FIG. 3 shows schematically a cross-section of the Flash memory cell in a further manufacturing step. The structure shown in FIG. 2 is etched, preferably by reactive ion etching, to remove the polished poly-Si layer 14 not covered by the access gate mask 20. In between the floating gate stacks A, B an access gate AG having an access gate length $1_{AG}$ is formed. Furthermore, the cell is completed with TEOS/nitride spacers (Tetra Ethyl Ortho Silicate, not shown), and source/drain implants S/D, D/S 22.

Because the access gate mask 20 overlaps on each side the floating gate stacks A, B, the actual length of the access gate is not determined by the width of the access gate mask 20 (provided the access gate mask 20 ends above the capping layers 6 of floating gate stacks A and B) and the misalignment of the access gate mask 20, but by the distance between the floating gate stacks A, B and the width of the side-wall spacers 10 located in between the floating gate stacks A, B. Since the floating gate stacks A, B are defined during the same lithography step, no misalignment exists between stacks A, B. The width of the side-wall spacers 10 can be controlled very accurately, as is known to persons skilled in the art. Therefore, the access gate length $1_{AG}$ does not need to take into account any misalignment between stacks A and B.

Consequently, the access gate length $1_{AG}$ can be taken minimal, as defined by the required electrical properties of the Flash memory cell. Actually, since the three transistors (as defined by floating gate stacks A, B, and access gate AG) effectively behave like a single long-channel transistor, it is expected that such a three-transistor device will suffer less from short-channel effects than other types of three-transistor devices from the prior art.

Further, the Flash memory cell according to the present invention is completed by silicidation, fabrication of local interconnects and pre-metal dielectric deposition. FIG. 4 shows schematically a cross-section of the Flash memory cell in a first embodiment after silicidation, fabrication of local interconnect and pre-metal dielectric deposition steps.

In FIG. 4, two "double poly-CMP" Flash memory cells C, D are shown at minimum pitch.

On source/drain implants 22 and on the access gates AG silicide layers 26 and 28 are formed, respectively. Between the "double poly-CMP" Flash memory cells C, D local interconnect layer LIL 30 is formed. The structure is covered by a pre-metal dielectric layer 32.

It is noted that the "double poly-CMP" Flash memory cell C, D is a symmetrical cell which allows fabrication of the two junctions of the cell with self-aligned LIL lines 30. Typically, LIL 30 comprises a rectangular W plug, as is known to persons skilled in the art.

Because these LIL lines 30 may partially overlap the floating gate stacks, it is not required to introduce additional margins to the floating gate stack width to compensate for misalignment of any contact holes. Advantageously, the Flash memory cells C, D can be placed with a minimal pitch parallel to the cross-section plane shown in FIG. 4.

FIG. 5 shows schematically a plane-view of an exemplary memory array in the first embodiment comprising Flash memory cells, placed in a virtual ground architecture, after completion of the front-end of line processing and local interconnect layers.

Line ZZ' indicates the direction of the cross-sectional plane shown in FIGS. 1–4.

Shallow Trench Isolation (STI) lines separate active lines 35, as indicated in FIG. 5. Word lines consisting of an upper control gate CGu, a lower control gate CGl and an access gate AG 12, run perpendicularly across the active lines 35 to form the "double poly-CMP" Flash memory cells. In the virtual ground architecture of the array, the self-aligned rectangular LIL lines 30 connect the shared source/drain junctions of a pair of cells in one active line alternately to those of their left or right neighboring pair of cells.

Figure 6:
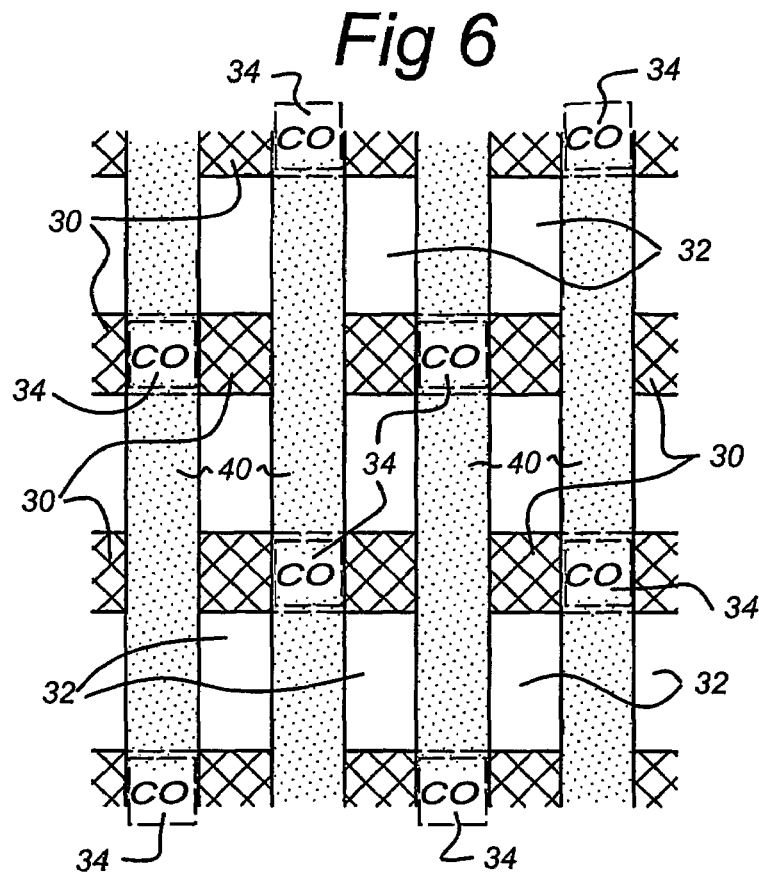
FIG. 6 shows schematically a plane view of the exemplary memory array comprising Flash memory cells, placed in a virtual ground architecture, after completion of the back-end of line processing.

FIG. 6 shows schematically a plane-view of the exemplary memory array comprising Flash memory cells, placed in a virtual ground architecture, after completion of the back-end of line processing. For reasons of clarity, only the rectangular LIL lines 30 are depicted as elements of the memory array. On top of the pre-metal dielectric layer 32, metal lines 40 are formed as bit-lines. Metallization may be done by using Cu or Al technology.

Contact openings CO are formed in the pre-metal dielectric layer 32 covering the cells. In these contact openings CO, first metal contacts 34, connecting the (first) metal bit-lines 40 to the respective centers of the LIL rectangles 30, are formed. Each metal line 40 is located above an STI line. First metal contacts may be formed by e.g., a damascene process (Cu technology) or by W-plug formation (Al technology).

The use of metal bit-lines 40 provides a distinct advantage to the Flash memory cells in a virtual ground architecture according to the present invention over other virtual ground configurations that use buried diffusions as bit-lines. In the cell configuration according to the present invention, the combination of metal bit-lines 40 and silicided access gates AG provides short read access times. Moreover, bit-line "strapping" methods from the prior art are not needed. It is noted that word line "strapping" may still be necessary, depending on the required read access time.

Further, it is noted that the metallization step of the silicided areas 28 and control gates CG; CGl, CGu may be done in the same process step, although the metallization step may also be done in another step.

Figure 7:
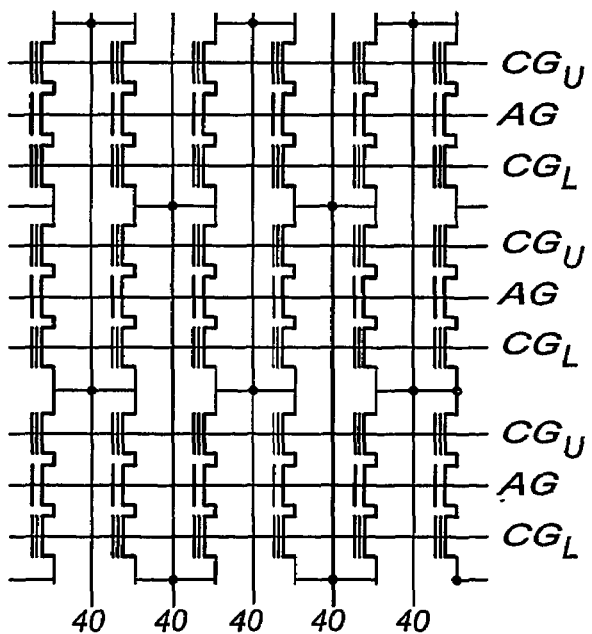
FIG. 7 shows schematically a first electric circuit equivalent to the memory array shown in FIGS. 5 and 6.

FIG. 7 shows schematically a first electric circuit equivalent to the memory array shown in FIGS. 5 and 6. The capacitive coupling between the access gates AG and the adjacent floating gates FG and control gates CGu, CGl has been omitted in this figure for reasons of clarity.

In the architecture of FIG. 7 four neighboring cells have one single bit-line contact in common.

The direction of the bit-lines 40 is parallel to the direction of the active lines and the STI lines.

The floating gate transistor FG of each cell can only be programmed selectively by source-side-injection (SSI) as known to those skilled in the art. Erasing can be done by Fowler-Nordheim tunneling of electrons off the floating gate FG. Selective Fowler-Nordheim programming is not possible since the required inhibit voltage on the junction of a cell that should be inhibited from programming is also present at the junction of the neighboring cell that shares the same control gate and bit-line contact. The neighboring cell is also inhibited and cannot be programmed.

However, the architecture can be simply modified to allow selective programming by either Fowler-Nordheim tunneling or SSI. This will be explained below with reference to FIGS. 8, 9 and 10.

Figure 8:
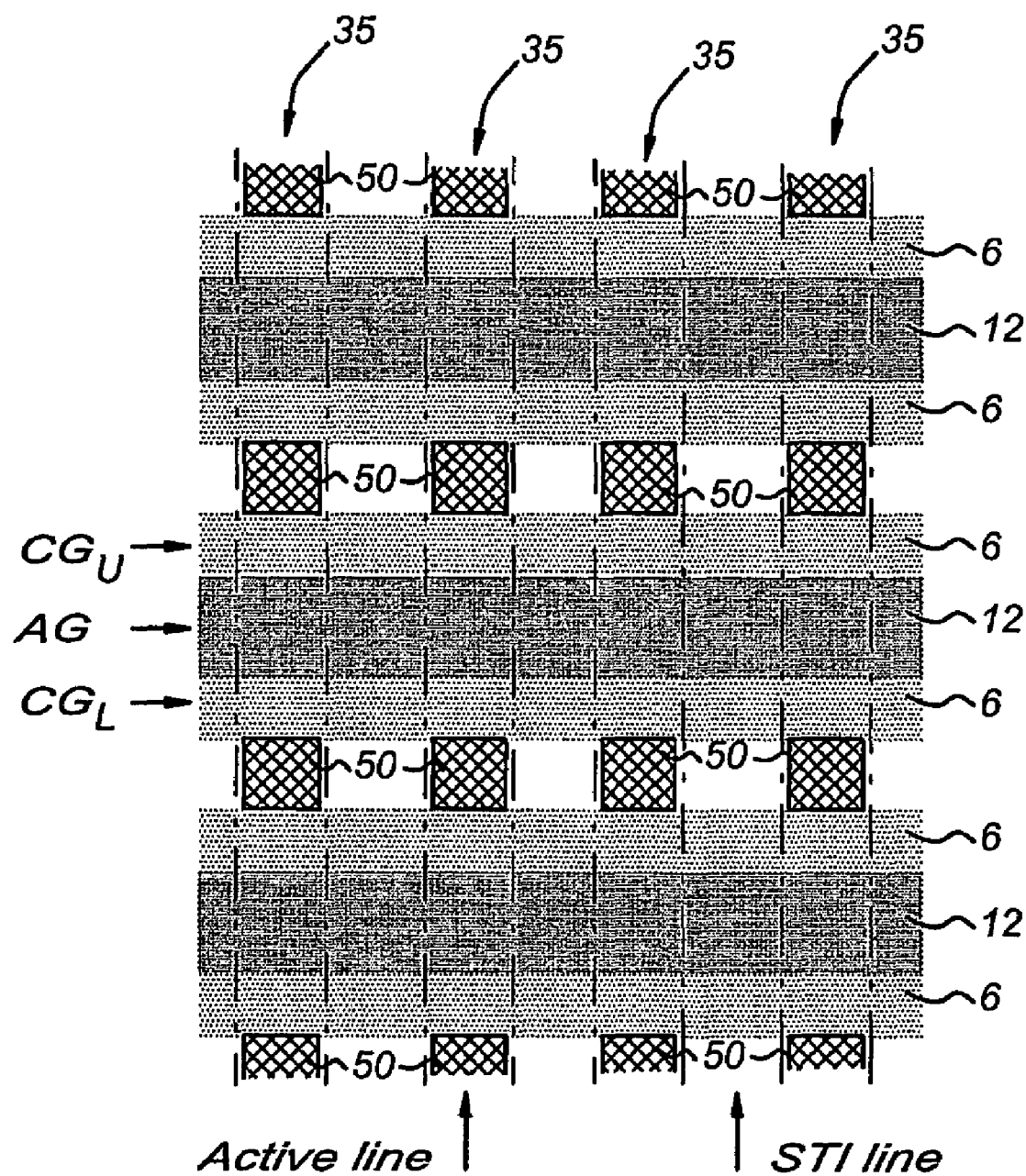
FIG. 8 shows schematically a plane view of an exemplary memory array in a second embodiment comprising Flash memory cells, placed in a virtual ground architecture, after completion of the front-end of line processing and contact openings.

FIG. 8 shows schematically a plane-view of an exemplary memory array in a second embodiment comprising Flash memory cells, placed in a virtual ground architecture, after completion of the front-end of line processing and contact openings.

These contact openings 50 are 'classical' contacts connecting the (first) metal bit-lines (not drawn in the figure) directly to the source/drain junctions. The contacts 50 may comprise a W contact plug. Note that no LIL option is needed in this embodiment.

Figure 10:
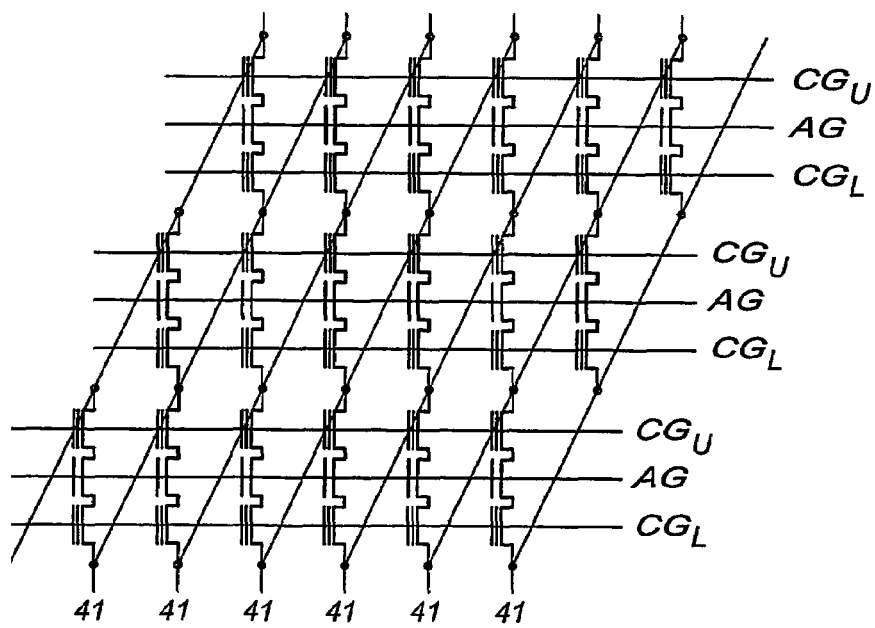
FIG. 10 shows schematically a second electric circuit equivalent to the memory array of the second embodiment.

Shallow Trench Isolation (STI) lines separate active lines 35, as indicated in FIG. 10. Word lines consisting of an upper control gate CGu, a lower control gate CGl and an access gate AG 12 run perpendicularly across the active lines 35 to form the "double poly-CMP" Flash memory cells, in a similar way as in the first embodiment. In the virtual ground architecture of the array, the contacts 50 connect the source/drain junction of single cells in each active line 35 without contacting "horizontally" neighboring cells. Two memory cells positioned adjacently in the direction parallel to bit-lines 40 of the array still share a bit-line contact 50, whereas two cells positioned adjacently in the direction perpendicular to bit-lines 40 do not.

Figure 9:
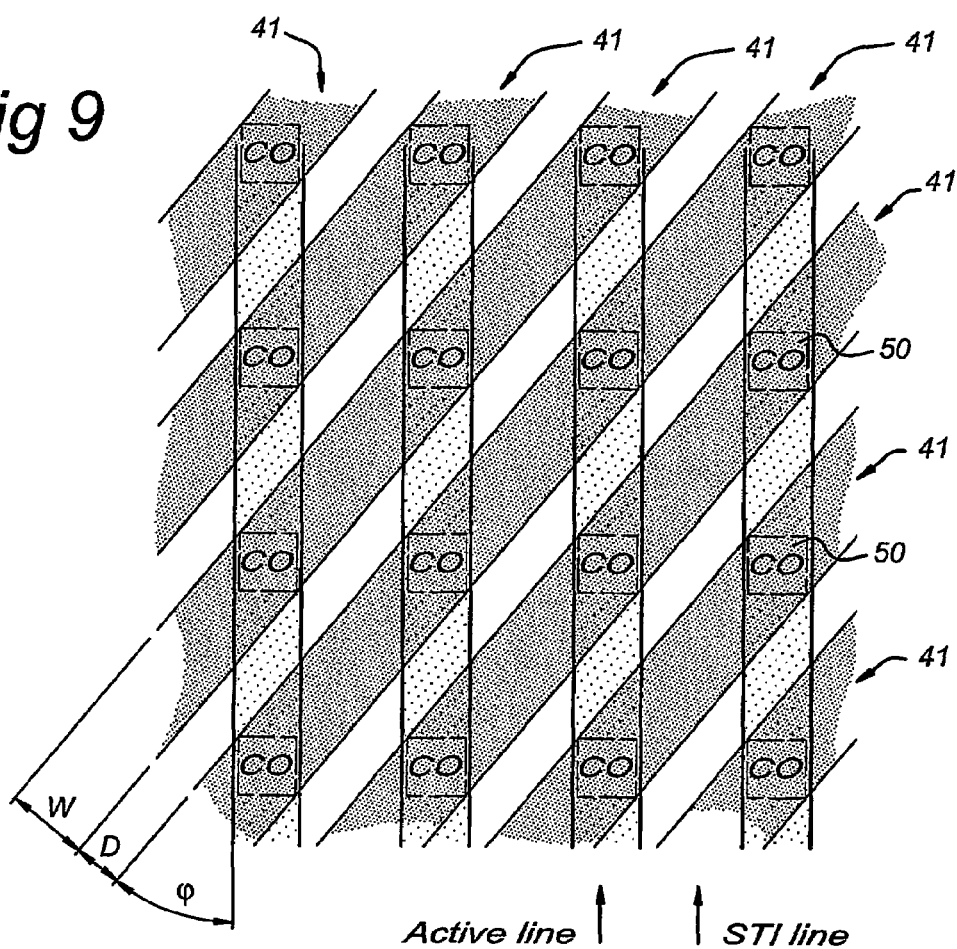
FIG. 9 shows schematically a plane view of a memory array in the second embodiment comprising Flash memory cells, placed in a virtual ground architecture, after completion of the bit-lines.

FIG. 9 shows schematically a plane-view of a memory array in the second embodiment comprising Flash memory cells, placed in a virtual ground architecture, after completion of the bit-lines.

In FIG. 9, a possible connection architecture is shown of the memory array shown in FIG. 8. This architecture comprises metal bit-lines 41 that are slanted relative to the word lines, active lines and STI lines.

In this "slanted" layout, cells do not share a single bit-line contact. The "slanted" layout may be used in devices where no LIL option is available. The bit-line contact now typically is a contact connecting directly as a direct contact 50 to the active area and may comprise a W contact plug. Since one contact connects to only one active area, the number of contacts in this layout is two times the number of contacts as used in a layout using a LIL option as shown in FIG. 6.

Besides the advantage that this layout can be used in processes not having a LIL option, it also has the additional advantage that, apart from SSI programming, this configuration is suited for selective Fowler-Nordheim programming. This is a direct result of the already mentioned fact that "horizontally" neighboring cells (i.e., cells sharing the same AG and CGu or CGl) are always connected to different bit lines.

This becomes more apparent from the equivalent electric circuit of the second embodiment, which is shown in FIG. 10.

FIG. 10 shows schematically a second electric circuit equivalent to the memory array of the second embodiment. It is noted that the architecture displayed here actually relates to the layout of the memory array comprising slanted metal bit-lines 41, the electric circuit as such may be drawn in various ways as known to persons skilled in the art.

The "slanted" layout of FIGS. 9 and 10 can be used too for 3-transistor memory cells consisting of two isolated floating gate transistors separated by an intermediate access gate. It is noted that in that case only Fowler-Nordheim programming is possible. Application of SSI programming requires compact cell architectures.

The slanted bit-line structure can be mapped to a rectangular matrix (at the expense of using an additional metal layer) by connecting the left-edge ("ending") and right-edge ("beginning") bit-lines 41 by means of "return lines" 41b made in the additional metal layer.

Figure 11A:
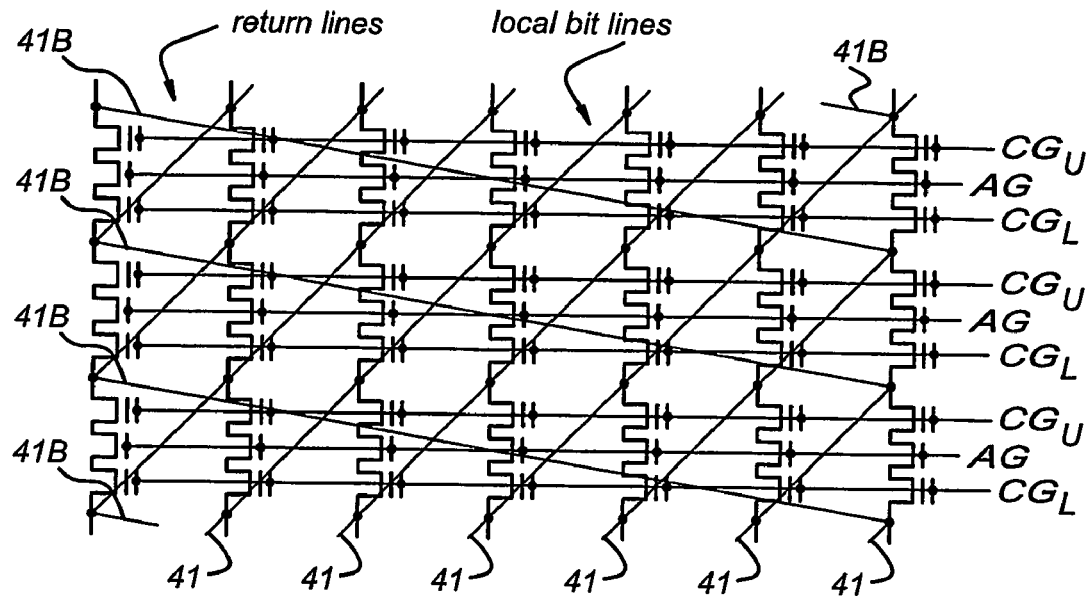
FIGS. 11a and 11b show a mapping across an entire array width and across smaller sections of the array, respectively.
Figure 11B:
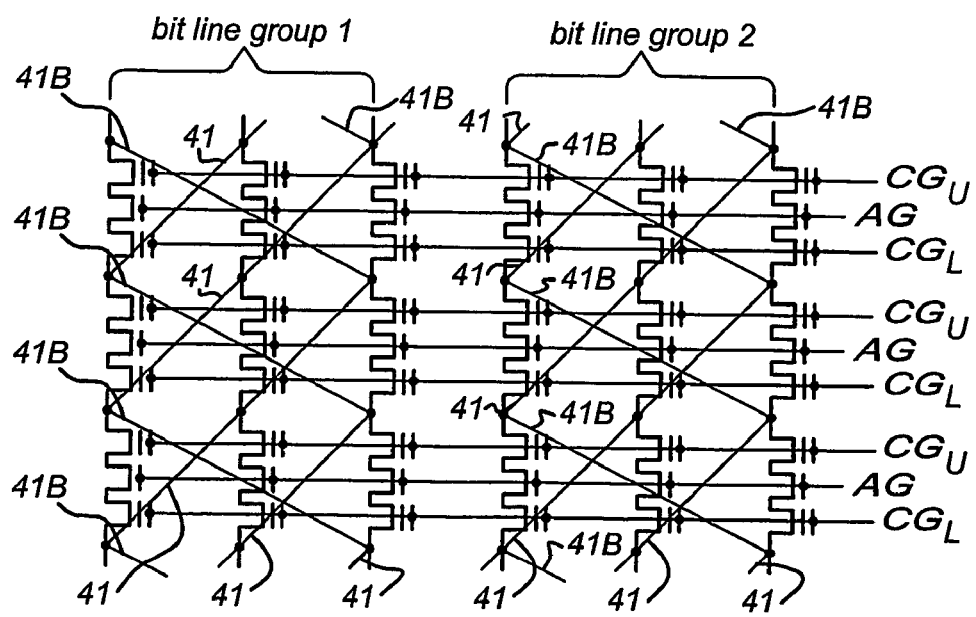

The rectangular mapping can be implemented across the entire array width (FIG. 11a) or across smaller bit-line sections (FIG. 11b, in this example two bit-line groups are shown. The section width of each bit-line group is only three bit-lines).

This is illustrated in FIGS. 11a and 11b which show an exemplary mapping across an entire array width and across smaller sections of the array, respectively.

Obviously, the minimum metal pitch of the slanted bit-lines 41 requires that the minimum pitch of the active lines is slightly larger than in the configuration of the first embodiment (FIG. 6). In some cases, this fact may be regarded as a disadvantage, depending on the actual design of the array.

This will be explained below. To conserve the spacing D between the bit-lines, the horizontal pitch of the cells with slanted bit-lines (i.e., in the second embodiment) has to be increased with respect to the pitch of the first embodiment (see FIGS. 8 and 6, respectively). This results in a minimal horizontal pitch of $(W+D)/\cos(\phi)$ with $\phi$ being the angle between the metal bit-lines and the active lines, and W being the minimum design rule for the metal width. In the case that the minimum metal-to-metal distance D equals the minimum metal width W, this simplifies to $2W/\cos(\phi)$. In summary, the cell density according to the second embodiment (i.e., the one with slanted bit-lines), is lower than that of the first embodiment (i.e., the one using LIL). Note that, thanks to the fact that two bits are stored in one cell, the second embodiment still has a higher bit density than flash memory arrays of the prior art, in spite of its larger cell pitch.

In a third embodiment of the present invention, the advantages of the second embodiment (viz. that no LIL 30 is required, and that cells are programmable by means of selective Fowler-Nordheim programming) are combined with the smaller horizontal pitch of the first embodiment, at the expense of an additional metal layer.

Figure 12A:
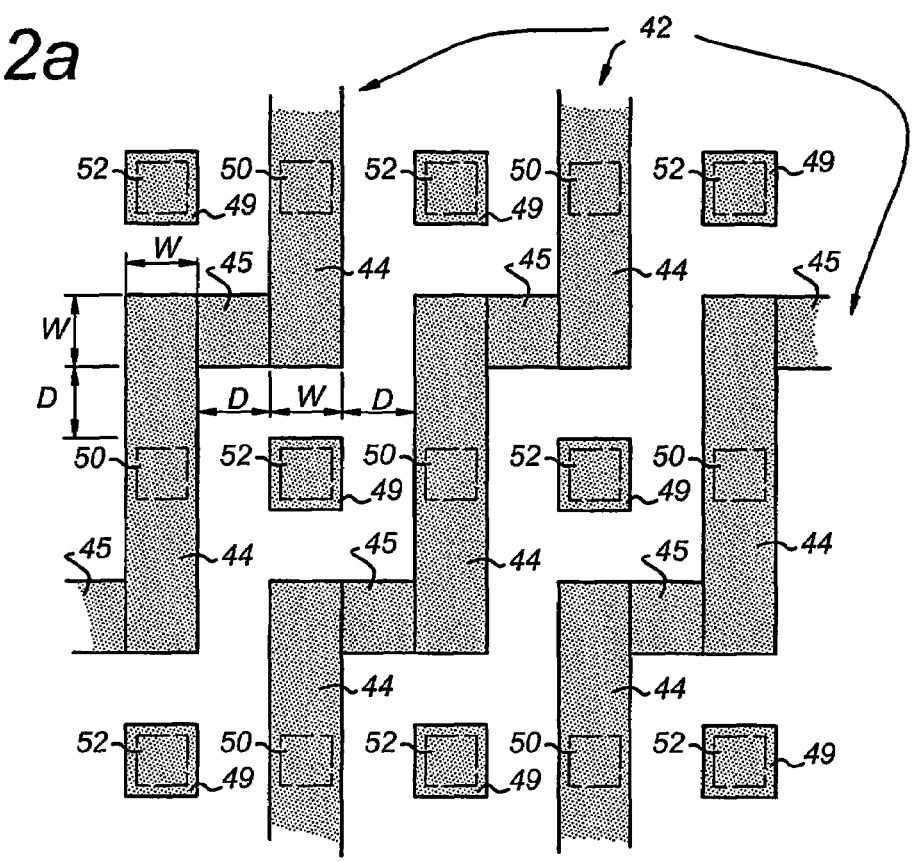
FIG. 12a shows schematically a plane view of a memory array in the third embodiment comprising flash cells according to the present invention placed in a virtual ground architecture, after completion of the bitlines, in a first metal level.
Figure 12B:
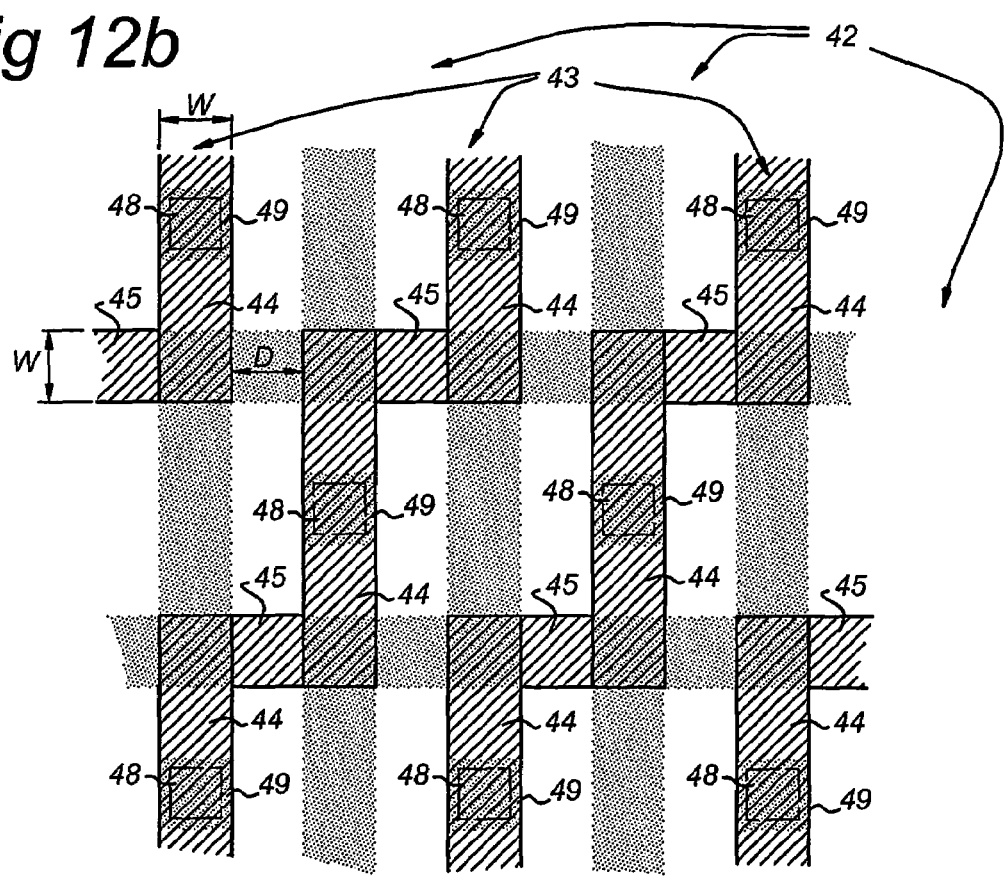
FIG. 12b shows schematically a plane view of a memory array in the third embodiment comprising flash cells according to the present invention placed in a virtual ground architecture, after completion of the bitlines, in the first metal level and a second metal level on top of the first metal level.

In the approach of this third embodiment, the horizontal pitch can be decreased without violation of the design rules by fabricating adjacent bit-lines in different metal levels, as is shown in FIGS. 12a and 12b, respectively.

FIG. 12a shows schematically a plane-view of a memory array in the third embodiment comprising flash cells according to the present invention placed in a virtual ground architecture, after completion of the bitlines, in a first metal level.

FIG. 12b shows schematically a plane-view of a memory array in the third embodiment comprising flash cells according to the present invention placed in a virtual ground architecture, after completion of the bitlines, in the first metal level and a second metal level on top of the first metal level.

For clarity, in FIGS. 12a and 12b, only the back-end of the line part of the array has been drawn. The front-end cell matrix (identical to FIG. 10, but with a slightly smaller horizontal pitch) is not shown in these drawings.

In this third embodiment, bit-lines are fabricated in two metal deposition processes, for a metal-1 and a metal-2 level, to have metal-1 bit-lines 42 and metal-2 bit-lines 43. In the metal-1 process, metal-1 bit-lines 42 are formed on a first half of the contacts 50, interspaced with metal-1 landing pads 49, as shown in FIG. 12a. Now, the "minimum metal pitch" design rule should be fulfilled with the scheme of alternating metal-1 bit-lines 42 and landing pads 49. Each of the landing pads 49 is connected to the source/drain junctions of the underlying cells by means of a contact 52. Depending on the details of the metal-1 patterning process it may prove advantageous to make the metal-1 landing pad area larger than a metal-1 minimum feature size squared. However, this is not a fundamental limitation, and therefore, it can be circumvented by persons skilled in the art of metal patterning.

As will be appreciated by persons skilled in the art, the metal-2 level is located above the metal-1 level and separated from metal-1 by a suitable isolation layer (not shown). The necessary connections between the metal-1 landing pads 49 and the metal-2 level bit-lines 43 are accomplished by via technology as known to persons skilled in the art. As is shown in FIG. 12b: in the metal-2 process, metal-2 bit-lines 43 are formed on vias 48 positioned on the metal-1 landing pads 49 in between the contacts 50 already connected by the metal-1 bit-lines 42.

In this way, the metal-2 bit-lines 43 are connected to the underlying source/drain junctions of the memory cells via the vertical stack formed by bit-line 43 (in metal 2), via, landing pad 49 (in metal 1) and contact 52.

Thus, adjacent to each metal-1 bit-line 42, a metal-2 bit-line 43 is formed and an alternating sequence of metal-1 and metal-2 bit-lines 42, 43 is obtained.

To obtain the high optimum density of the memory array, the metal-1 bit-lines 42 and metal-2 bit-lines 43 are step-wise slanted: each bit-line comprises first line parts 44 and second line parts 45. A metal-1 bit-line 42 is arranged to have a first line part 44 over a direct contact 50 and a second line part 45 in between two first line parts 44. A metal-2 bit-line 43 is arranged to have a first line part 44 over a via 48 and a second line part 45 in between two first line parts 44.

Preferably, the first line parts 44 run in a first direction parallel to the active lines and the STI lines, and the second line parts 45 run in a second direction perpendicular to the active lines and the STI lines or are slanted (e.g., at 45° relative to the active lines and STI lines). The relative length of a first line part and a second line part within the vertical pitch distance will determine the actual shape of each bit-line 42, 43.

Because two adjacent metal-1 and metal-2 bit-lines 42, 43 are in different metal layers in this configuration, the distance in between adjacent bit-lines 42, 43 (measured in a direction parallel to the plane of the substrate) and for adjacent first line parts 44 and adjacent second line parts 45, respectively, in the respective bit-lines 42, 43 can be smaller than the minimal metal spacing (given by the design rules). Hence, the optimum density structure of a memory array according to the present invention can be achieved without the need for increasing the pitch of the cells.

Furthermore, an alternating sequence of metal-1 and metal-2 bit-lines 42, 43 (processed in separate metal depositions) reduces the risk of shorts between adjacent bit-lines. Also, the second line parts 45 of the bit-lines 42, 43 may be wider than the minimum width (as set forth by the design rules). These two facts may favorably increase the yield of the fabrication process.

Figure 12C:
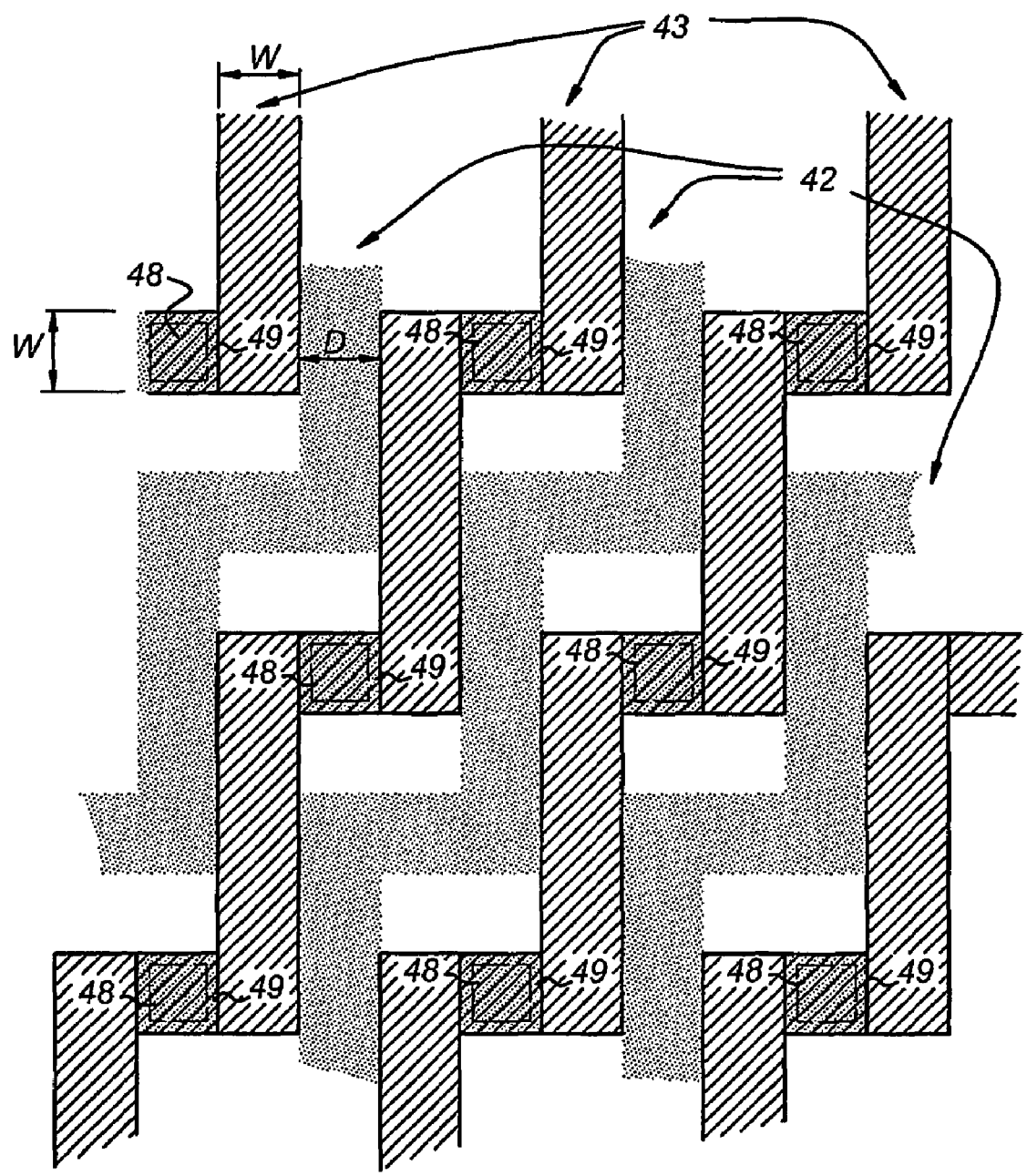
FIG. 12c shows an alternative layout of the memory array as shown in FIG. 12b.

An alternative to the layout of FIG. 12*b* is shown in FIG. 12*c*. Other alternative layouts may be apparent to persons skilled in the art.

As will be appreciated by persons skilled in the art, the Flash memory cell according to the present invention can store bits at a higher density (about twice the number of bits per unit area) than Flash memory cells from the prior art in the same technology generation, due to the storage of 2 bits per cell, the full self-alignment of the gates, and the connection to self-aligned LIL 30 or contacts 50, 52 at both sides of the cell.

Further, the Flash memory cell according to the present invention, has the advantage of the capability of SSI programming. Known 1-transistor NVM cells can achieve very high densities as well, but programming can only be done by channel hot electron injection (CHEI), which requires much higher currents per cell than SSI programming.

Also, 1-transistor NVM cells have junctions on both sides of the floating gate and therefore suffer more from short-channel effects than the Flash memory cell according to the present invention. To compensate for these short channel effects, the floating gate in 1-transistor NVM cells has to be considerably larger than in a Flash memory cell according to the present invention (and using the same technology generation).

Finally, it is noted that Flash memory cells according to the first embodiment of the present invention may also be manufactured without the use of LIL. When LIL 30 is omitted from the Flash memory cells for contacting two adjacent active areas, the formation of contact between the two active areas must be done by means of the first metal level. In that case, adjacent contacts on the active areas are interconnected by metal-1 shaped as rectangular lines similar to the shape of LIL as described above.

In the first embodiment the bit-lines 40 must then be formed in the second metal level located above and isolated from the first metal level. Via technology (i.e., vias between metal-1 and metal-2) is used to connect to the metal-1 rectangles above the active areas.

A possible disadvantage of this alternative for the first embodiment is that in the definition of the metal-1 rectangular lines a finite overlap with the contact openings to the active areas is required to compensate for so-called "line-end shortening", a phenomenon that line-ends of thin lines are shortened during lithographic processing due to diffraction effects of the finite wavelength of the illumination source.

In the second and third embodiments where "slanted" bit-lines are described, the LIL is omitted altogether. Here the metal contacts already are positioned directly above active lines without the need for a LIL option to make a common contact to two neighboring cells.

Besides the capability of SSI or Channel Hot Electron programming, the second and third embodiments have the capability of selective Fowler-Nordheim programming.

Finally, it is noted that in the memory cell according to the present invention, the stack of tunnel oxide, floating gate FG, interpoly dielectric layer 8, control gate CG can be replaced by a stack consisting of a charge trapping layer and a control gate CG ("charge trapping memory cell"). The charge trapping layer typically consists of stacked layers of silicon dioxide, silicon nitride and silicon dioxide (an ONO layer), in which the silicon nitride layer is capable of trapping electrons. Instead of silicon nitride, a layer of oxygen-rich silicon, or silicon nanocrystals dispersed in silicon dioxide can be used as a trapping medium. The charge trapping ONO layer comprises a thickness of 2 to 7 nm for the lower silicon dioxide layer (i.e., the silicon dioxide layer closer to the semiconductor surface), approximately 5 nm for the silicon nitride layer, and 4 to 8 nm for the upper silicon dioxide layer, respectively. The formation process of such an ONO layer and its integration for the fabrication of the memory cell will be known to persons skilled in the art.

This alternative charge trapping memory cell can be applied in the same array structures as described with reference to the memory cell comprising a floating gate FG.

Programming of these arrays consisting of charge trapping memory cells can be done in a similar way as for arrays equipped with memory cells comprising a floating gate. In the case of thin lower silicon dioxide layers (thickness ~2 nm) Fowler-Nordheim tunneling is possible. Erasing of cells can be done by Fowler-Nordheim tunneling or Hot Hole Injection for thin lower silicon dioxide layers (~2 nm). For thicker lower silicon dioxide layers only erasure by Hot Hole Injection is feasible.

Fabrication of a memory cell, the cell including a first floating gate stack, a second floating gate stack and an intermediate access gate, the floating gate stacks including a first gate oxide, a floating gate, a control gate, an interpoly dielectric layer, a capping layer and side-wall spacers, the cell further including source and drain contacts, wherein the fabrication includes:
 defining the floating gate stacks in the same processing steps to have equal heights;
 depositing over the floating gate stacks a poly-Si layer with a larger thickness than the height of the floating gate stacks;
 planarizing the poly-Si layer;
 defining the intermediate access gate in the planarized poly-Si layer by a masking step with an access gate mask over the poly-Si layer between the floating gate stacks and a poly-Si etching step.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements.

The invention claimed is:

1. Method for fabrication of a memory cell, for storing at least one bit, on a semiconductor substrate, comprising on said substrate a first floating gate stack (A), a second floating gate stack (B) and an intermediate access gate, said first and second floating gate stacks comprising a first gate oxide layer a floating gate, a control gate, an interpoly dielectric layer, a capping layer and side-wall spacers, said first gate oxide layer being located on said substrate, said floating gate being on top of said first gate oxide layer, said interpoly dielectric layer being on top of said floating gate, said control gate being on top of said interpoly dielectric layer, said capping layer being on top of said control gate, said memory cell further comprising source and drain contacts, said method of fabrication comprising:
- defining said first and second floating gate stacks in the same processing steps to have substantially equal heights;
- depositing a poly-Si layer over said first and second floating gate stacks, said poly-Si layer being deposited in between said first and second floating gate stacks in a thickness equal to or larger than the height of said first and second floating gate stacks;
- planarizing said poly-Si layer by chemical mechanical polishing to obtain a planarized poly-Si layer, using said capping layer of said first and second floating gate stacks as a polish stop layer;
- defining said intermediate access gate in said planarized poly-Si layer by a masking step with an access gate mask over said planarized poly-Si layer between said first and second floating gate stacks and an etching step for poly-Si.

2. Method for fabrication of a memory cell, according to claim 1, characterized by:
- forming on top of said intermediate access gate a first self-aligned silicide area and on top of said source and drain contacts a second self-aligned silicide area;
- forming on said second self-aligned silicide area a local interconnect;
- depositing on top of said local interconnect, said first self-aligned silicide area, and said capping layer a pre-metal dielectric layer;
- forming a contact opening in said pre-metal dielectric layer to said local interconnect;
- filling said contact opening with a metal contact to said local interconnect; and
- defining on top of said pre-metal dielectric layer at least one metal line as a bit-line.

3. Method for fabrication of a memory cell, according to claim 1, characterized by:
- forming on top of said intermediate access gate a first self-aligned silicide area and on top of said source and drain contacts a second self-aligned silicide area;
- depositing on top of said second self-aligned silicide area, said first self-aligned silicide area and said capping layer a pre-metal dielectric layer;
- forming a contact opening in said pre-metal dielectric layer to said second self-aligned silicide area;
- filling said contact opening with a metal contact to said second self-aligned silicide area; and
- defining on top of said pre-metal dielectric layer at least one metal line as a bit-line, said bit-line being slanted.

4. Method for fabrication of a memory cell, according to claim 1, characterized by:
- forming on top of said intermediate access gate a first self-aligned silicide area and on top of said source and drain contacts a second self-aligned silicide area;
- depositing on top of said second self-aligned silicide area, said first self-aligned silicide area and said capping layer a pre-metal dielectric layer;
- forming a contact opening in said pro-metal dielectric layer to said second self-aligned silicide area;
- filling said contact opening with a contact to said second self-aligned silicide area; and
- defining on top of said pre-metal dielectric layer in a first metal level said bit-line for connecting to said contact opening (CO), said bit-line being slanted.

5. Method for fabrication of a memory cell, according to claim 4, characterized by:
- forming on top of said intermediate access gate a first self-aligned silicide area and on top of said source and drain contacts a second self-aligned silicide area;
- depositing on top of said second self-aligned silicide area, said first self-aligned silicide area, and said capping layer a pre-metal dielectric layer;
- forming a contact opening in said pre-metal dielectric layer to said second self-aligned silicide area;
- filling said contact opening with a contact to said second self-aligned silicide area; and
- defining on top of said pre-metal dielectric layer in said first metal level a landing pad on top of said contact for connecting to said contact opening by means of:
- depositing an intermetal dielectric layer,
- forming a further contact opening as a via opening in said intermetal dielectric layer,
- filling said via opening with a contact acting as a via, and
- defining in a second metal level a further slanted bit-line on top of said intermetal dielectric layer for connection to said contact acting as a via, said contact acting as a via being connected to said landing pad.

6. Method for fabrication of a memory cell, according to claim 1, characterized by:
- said floating gale FG consisting of a trapping medium,
- said trapping medium comprising an ONO layer stack, an oxygen-rich silicon layer, or a silicon dioxide layer comprising silicon nanocrystals dispersed therein.

7. An array of memory cells, wherein the array of memory cells includes a memory cell, for storing at least one bit, on a semiconductor substrate, comprising on said substrate a first floating gate stack, a second floating gate stack and an intermediate access gate, said first and second floating gate stacks comprising a first gate oxide layer, a floating gate, a control gate, an interpoly dielectric layer, a capping layer and sidewall spacers, said first gate oxide layer being located on said substrate, said floating gate being on top of said first gate oxide layer, said interpoly dielectric layer being on top of said floating gate, said control gate being on top of said interpoly dielectric layer, said capping layer being on top of said control gate, said memory cell further comprising source and drain contacts, characterized in that
- said first and second floating gate stacks have substantially equal heights;
- said intermediate access gate comprises a planarized poly-Si layer in between said first and second floating gate stacks,
- wherein the memory cell further includes,
  - a first self-aligned silicide area formed on top of said intermediate access gate and a second self-aligned silicide area formed on top of said source and drain contacts;
  - a local interconnect formed on said second self-aligned silicide area;
  - a pre-metal dielectric layer deposited on top of said local interconnect, deposited on top of said first self-aligned silicide area, and deposited on top of said capping layer;
  - a contact opening formed in said pre-metal dielectric layer to said local interconnect;
  - said contact opening filed with a metal contact to said local interconnect; and
  - at least one metal line defined as a bit-line on top of said pre-metal dielectric layer; and
- the memory array includes at least two adjacent memory cells arranged in a virtual ground arrangement; and in said virtual ground arrangement a bit-line is a metal line; said bit-line being connected to said second self-aligned silicide area by a contact in said contact opening.

8. Array of memory cells according to claim 7, characterized in that in said array of memory cells at least two memory cells connect to said contact opening for said bit-line.

9. Array of compact memory cells, according to claim 8, characterized in that said bit-line is slanted and connected to memory cells, which are not horizontally neighboring cells having the same control gate.

10. Array of compact memory cells according to claim 8, characterized in that in a first metal deposition process level (metal-1) said bit-line as a metal-1 bit-line comprises a plurality of first line parts running in a direction parallel to said active lines and a plurality of second line parts, each of said first line parts being formed on top of one of said contacts, said second line parts being formed in between said contacts, and in a second metal deposition process level (metal-2) said bit-line as a metal-2 bit-line comprises a plurality of first line parts running in a direction parallel to said active lines and a plurality of second line parts, each of said first line parts being formed on top of one of said contacts acting as a via, said second line parts being formed in between said contacts acting as a via;

said bit-line running step-wise for connecting to memory cells, which are not horizontally neighboring cells having the same control gate, with each of said second line parts running in a direction perpendicular to said active lines or running in a slant direction relative to said active lines.

* * * * *